United States Patent
Sun et al.

(10) Patent No.: US 7,479,464 B2
(45) Date of Patent: Jan. 20, 2009

(54) LOW TEMPERATURE AEROSOL DEPOSITION OF A PLASMA RESISTIVE LAYER

(75) Inventors: Jennifer Y. Sun, Sunnyvale, CA (US);
Elmira Ryabova, Mountain View, CA (US); Senh Thach, Union City, CA (US); Xi Zhu, San Jose, CA (US); Semyon L. Kats, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/552,013

(22) Filed: Oct. 23, 2006

(65) Prior Publication Data

US 2008/0108225 A1  May 8, 2008

(51) Int. Cl.
*H01L 21/31* (2006.01)
(52) U.S. Cl. ............... 438/785; 257/E21.161
(58) Field of Classification Search .......... 438/785; 257/E21.16, E21.207
See application file for complete search history.

(56) References Cited

U.S. PATENT DOCUMENTS

| 2002/0192375 | A1 | 12/2002 | Sun et al. | |
|---|---|---|---|---|
| 2004/0026030 | A1* | 2/2004 | Hatono et al. | 156/279 |
| 2004/0043230 | A1 | 3/2004 | Hatono et al. | |
| 2004/0126814 | A1 | 7/2004 | Maeda et al. | |
| 2004/0227227 | A1 | 11/2004 | Imanaka et al. | |
| 2006/0141144 | A1 | 6/2006 | Hatono et al. | |
| 2006/0159946 | A1* | 7/2006 | Iwasawa et al. | 428/620 |
| 2007/0079936 | A1* | 4/2007 | Li et al. | 156/345.48 |

FOREIGN PATENT DOCUMENTS

| EP | 1158072 A | 11/2001 |
|---|---|---|
| EP | 1231294 A | 8/2002 |
| EP | 1777317 A | 4/2007 |
| EP | 1777731 A | 4/2007 |

OTHER PUBLICATIONS

Jun Akedo, et al. *"Aerosol Deposition Method (ADM) for Nano-Crystal Ceramics Coating Without Firing"*, Material Research Society Symp. Proc. vol. 778 (2003).
X.W. Wang, et al. *"RF Plasma Aerosol Deposition of Superconductive $Y_1B_52Cu_3O_{1-4}$ Films at Atmospheric Pressure"*, Applied Physics Letter. vol. 57, Issue 15, pp. 1581-1583 (Oct. 1990).
Iwasawa, J., et al.; Dense yttrium oxide film prepared by aerosol deposition process at room temperature; Journal of the Ceramic Society of Japan, vol. 114, No. 3, Mar. 2006, pp. 272-276, Ceramic Soc. Japan, Japan (XP002465007).

(Continued)

*Primary Examiner*—Trung Dang
(74) *Attorney, Agent, or Firm*—Patterson & Sheridan, LLP

(57) ABSTRACT

Embodiments of the present invention provide a method for low temperature aerosol deposition of a plasma resistive layer on semiconductor chamber components/parts. In one embodiment, the method for low temperature aerosol deposition includes forming an aerosol of fine particles in an aerosol generator, dispensing the aerosol from the aerosol generator into a processing chamber toward a surface of a substrate, maintaining the substrate temperature at between about 0 degrees Celsius and 50 degrees Celsius, and depositing a layer from material in the aerosol on the substrate surface.

21 Claims, 2 Drawing Sheets

OTHER PUBLICATIONS

Iwasawa, J., et al.; Plasma-resistant dense yttrium oxide film prepared by aerosol deposition process at room temperature; Journal of the Ceramic Society of Japan, vol. 90, No. 8, Aug. 2007, pp. 2327-2332, Ceramic Soc. Japan, Japan (XP002465008).

Lebedev, M., et al.; Substrate heating effects on hardness of an alpha-A1203 thick film formed by aerosol deposition method; Journal of Crystal Growth, vol. 275, No. 1-2, Feb. 15, 2005, pp. e1301-e1306, Elsevier, Amsterdam, NL (XP004823430).

Extended European Search Report dated Feb. 11, 2008 (EP 07020054.8-2122).

\* cited by examiner

LOW TEMPERATURE AEROSOL DEPOSITION OF A PLASMA RESISTIVE LAYER

BACKGROUND OF THE INVENTION

1. Field of the Invention

Embodiments of the invention generally relate to a semiconductor processing, more specifically, for low temperature aerosol deposition of a plasma resistive layer on semiconductor processing chamber components.

2. Description of the Related Art

Semiconductor processing involves a number of different chemical and physical processes whereby minute integrated circuits are created on a substrate. Layers of materials which make up the integrated circuit are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

A typical semiconductor processing chamber includes a chamber body defining a process zone, a gas distribution assembly adapted to supply a gas from a gas supply into the process zone, a gas energizer, e.g., a plasma generator, utilized to energize the process gas to process a substrate positioned on a substrate support assembly, and a gas exhaust. During plasma processing, the energized gas is often comprised of highly corrosive species which etches and erodes exposed portions of the processing chamber components. Eroded chamber components may accelerate the disassembly of the component parts. Attack from corrosive species also reduces the lifespan of the chamber components. Additionally, flakes of the eroded parts of the chamber component may become a source of particulate contamination during substrate processing. Therefore, promoting plasma corrosion resistance of chamber components is desirable to increase service life of the processing chamber, reduce chamber downtime, reduce maintenance frequency and to improve substrate yields.

Conventionally, the processing chamber surface may be anodized to provide a degree of protection from the corrosive processing environment. Alternatively, dielectric and/or ceramic layers, such as aluminum nitride (AlN), aluminum oxide ($Al_2O_3$), silicon oxide ($SiO_2$), or silicon carbide (SiC), may be coated and/or formed on the component surface to promote the surface protection of the chamber components. Several conventional methods utilized to coat the protective layer include physical vapor deposition (PVD), chemical vapor deposition (CVD), sputtering, plasma spraying coating, aerosol deposition (AD) and the like. The conventional coating techniques typically employ a substantially high temperature to provide sufficient thermal energy to sputter, deposit or eject a desired amount of materials on a component surface. However, high temperature processing may deteriorate surface properties or adversely modify the microstructure of the coated surface, resulting in a coated layer having poor uniformity and/or surface cracks due to temperature elevation. Furthermore, if the coated layer or the underlying surface has microcracks or the coatings are not applied uniformly, the component surface may deteriorate over time and eventually expose the underlying component surface to corrosive plasma attack.

Therefore, there is a need for an improved method for coating and/or forming a robust plasma resistive layer on surfaces of chamber components.

SUMMARY OF THE INVENTION

Embodiments of the present invention provide a method for low temperature aerosol deposition of a plasma resistive layer on semiconductor chamber components/parts. In one embodiment, the method for low temperature aerosol deposition includes forming an aerosol of fine particles in an aerosol generator, dispensing the aerosol from the generator into a processing chamber and toward a surface of a substrate, maintaining the substrate temperature at between about 0 degrees Celsius and 50 degrees Celsius, and depositing a layer from material in the aerosol on the substrate surface.

In another embodiment, a method for low temperature aerosol deposition includes forming an aerosol of fine particles in an aerosol generator, dispensing the aerosol from the generator into a processing chamber toward a surface of a substrate, maintaining the substrate temperature at between about 0 degrees Celsius and 50 degrees Celsius, and depositing a rare earth metal containing layer on the substrate surface.

In yet another embodiment, a method for low temperature aerosol deposition includes forming an aerosol of fine particles from an aerosol generator having a diameter less than 2 $\mu m$, dispensing the aerosol from the generator into a processing chamber toward a surface of a substrate, maintaining the substrate temperature at between about 0 degrees Celsius and 50 degrees Celsius, and depositing a rare earth metal containing layer on the substrate surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

Figure 1:
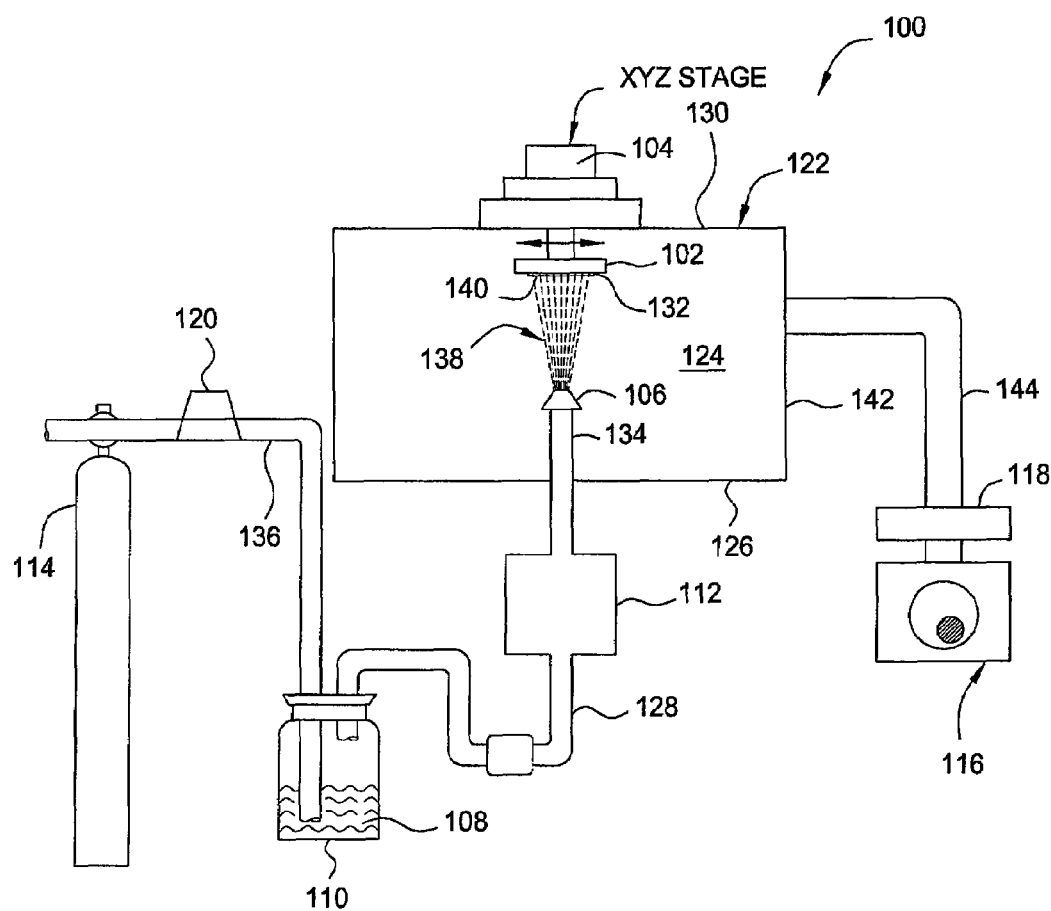
FIG. 1 depicts a sectional view of one embodiment of a aerosol deposition apparatus.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

FIG. 1 is a sectional view of one embodiment of an apparatus 100 that may be utilized to perform an aerosol deposition (AD) process according to the present invention. The inventive aerosol deposition (AD) process forms a plasma resistive layer that may be utilized to beneficially protect surfaces exposed to plasma process. The apparatus 100 includes a processing chamber 122 having a top 130, a bottom 126, and sidewalls 142 that define a process region 124 in the interior volume of the processing chamber 122. A stage 104 is disposed on the top 130 of the processing chamber 122 to a substrate holder 102 that holds a substrate 132 during processing. The stage 104 is configured to move the holder 102 along the X, Y, and Z axes. Thus, the stage 104 moves the substrate 132 positioned thereon along the X, Y, and Z axis. A mechanical booster pump 116 and a rotary pump 118 are coupled to the processing region 124 through a port formed in the sidewall 142 of the processing chamber 122 to maintain vacuum pressure during processing.

An aerosol generator 110 is coupled to the processing chamber 122 through the bottom 126 of the processing chamber 122 by a carrier pipe 128. The carrier pipe 128 extends through the processing chamber bottom 126 to the processing region 124. An injection nozzle 106 is disposed at an end 134 of the carrier pipe 128 to facilitate injection of an aerosol toward a surface 140 of the substrate 132. Multiple nozzles may be utilized to assist dispensing aerosol toward the surface 140 as needed. In embodiments where multiple nozzles are utilized, the nozzles may be coupled to the generator by a common or individual carrier pipes. It is contemplated that the nozzles may direct the aerosol to the substrate 132 at different angles.

A filter 112 may be optionally disposed between the processing chamber 122 and the aerosol generator 110 to assist in controlling the particle size of the aerosol generated by the aerosol generator 110.

A raw material 108 is disposed in the aerosol generator 110. An aerosol is generated from the raw material 108 and is delivered through the nozzle 106 into the processing region 124. The aerosol is utilized to form a plasma resistive layer on the substrate 132. In one embodiment, the raw material 108 may be fine ceramic particles, fine metal particles, or fine composite particles. In another embodiment, the raw material 108 may be ceramic particles having an average diameter between about 0.05 μm and about 3 μm, for example less than 2 μm. In yet another embodiment, the raw material 108 may be a rare earth material and/or rare earth oxide providing corrosive plasma resist properties. In an exemplary embodiment, the raw material 108 may be ultra fine yttrium containing particles such as yttrium oxide ($Y_2O_3$) particles, bulk yttrium (Y) particles, or yttrium (Y) alloy, having an average diameter between about 0.05 μm and about 3 μm, for example less than 2 μm, such as 1 μm. In yet another embodiment, the raw material 108 may be ultra fine yttrium containing particles mixed with metal particles. Suitable metal particles include aluminum (Al), magnesium (Mg), titanium (Ti), tantalum (Ta), and the like. The coating made from yttrium containing particles has a good resistivity from plasma while processing at a corrosive plasma environment. In embodiments depicted in the present invention, the raw material 108 is an ultra fine yttrium containing particles having an average diameter of less than 2 μm, such as less than 0.5 μm.

A gas cylinder 114 and a mass flow controller (MFC) 120 are sequentially coupled to the aerosol generator 110 through a delivery line 136. The gas cylinder 114 provides carrier gases having a pressure sufficiently high enough to eject a desired amount of raw material 108 in aerosol form to the processing chamber 122. The high carrier gas pressure from the gas cylinder 114 forms a raw material jet stream 138 having entrained raw material 108 that is dispensed toward the substrate surface 140. The raw material 108 in the jet stream 138 forms a plasma resistive protective coating layer on the substrate surface 140. The flow and/or velocity of the stream 138 may be controlled by the mass flow controller (MFC) 120, carrier gas pressure or by the shape and/or opening diameter of the nozzle 106. In one embodiment, the carrier gas provided in the gas cylinder may be at least one of nitrogen gas ($N_2$), hydrogen gas ($H_2$), oxygen gas ($O_2$), fluorine gas ($F_2$), and inert gas, such as Argon (Ar), helium (He), neon (Ne), among others.

In operation, raw material 108, for example, yttrium containing particles having an average diameter less than 0.5 μm, are disposed in the aerosol generator 110 as the source of the plasma resistive layer deposition. The carrier gas from the gas cylinder 114 is supplied into the aerosol generator 110 to form an aerosol from the raw material 108. The pressure and ejection rate of the carrier gas from the gas cylinder 114 is controlled to provide sufficient kinetic energy and momentum to accelerate the particles of raw material 108 into the processing chamber 122. Additionally, the pressure and ejection rate of the raw material 108 has sufficient kinetic energy and momentum to promote bonding adhesion of the particles of raw material 108 to the substrate surface 140 without adversely damaging the underlying bulk substrate material. In one embodiment, the pressure of the carrier gas may be maintained at between about 10 Pa and about 50 Pa and the ejection rate of the carrier gas may be controlled at between about 250 meters per second (m/s) and about 1750 meters per second (m/s). The formed aerosol of the raw material 108 is subsequently supplied into the processing chamber 122.

In one embodiment, the pressure of the processing chamber 122 may be maintained at a pressure less than the pressure of the aerosol generator 110, thereby facilitating the raw material 108 to be ejected therefrom. In one embodiment, the pressure of the processing chamber 122 is maintained at between about 2 Torr and about 10 Torr, and the pressure of the aerosol generator 110 may be maintained at between about 10 Pa and about 50 Pa. Alternatively, a pressure differential between the processing chamber 122 and the aerosol generator 110 may be controlled in a range between about 10 Pa and about 100 Pa, such as about 25 Pa and about 75 Pa to facilitate of the aerosol flow of the ultra fine yttrium containing particles 108.

The aerosol of raw material 108 impacts the substrate surface 140 with sufficient energy to remove contaminants or impurities on the substrate surface 140, if present. The collision between the raw material 108 and the substrate surface 140 actives the substrate surface 140 as a result of the mutual collision. Subsequently, the particles of raw material 108 impinge the substrate surface 140 and bond strongly thereto, thereby coating and/or depositing the plasma resistive layer on the substrate surface 140.

The substrate 132 positioned on the substrate holder 102 is maintained at a low temperature substantially similar to the adjacent environment to eliminate temperature variation during processing. In one embodiment, the substrate 132 is maintained at a room temperature substantially similar to the adjacent environment. In another embodiment, the substrate 132 is maintained at a temperature at between about 0 degrees Celsius and about 50 degrees Celsius, such as between about 10 degrees Celsius and about 40 degrees Celsius, for example, about 25 degrees Celsius. The low and steady processing temperature of the substrate 132 prevents the substrate 132 from undergoing excessive temperature fluctuation, thermal shock and/or expansion during deposition, thereby minimizing the stress induced between the coating and the underlying surface. The consistent low processing temperature prevents the microstructure and surface roughness of the substrate surface 140 from thermal damage, thereby providing a uniform and consistent substrate surface condition which results in a robust and long lasting protective layer.

The delivery of the raw material 108 to the substrate 132 is maintained until a desired thickness of the plasma resistive layer is reached. In one embodiment, the plasma resistive layer has a thickness between about 1 μm and between about 500 μm.

Figure 2:
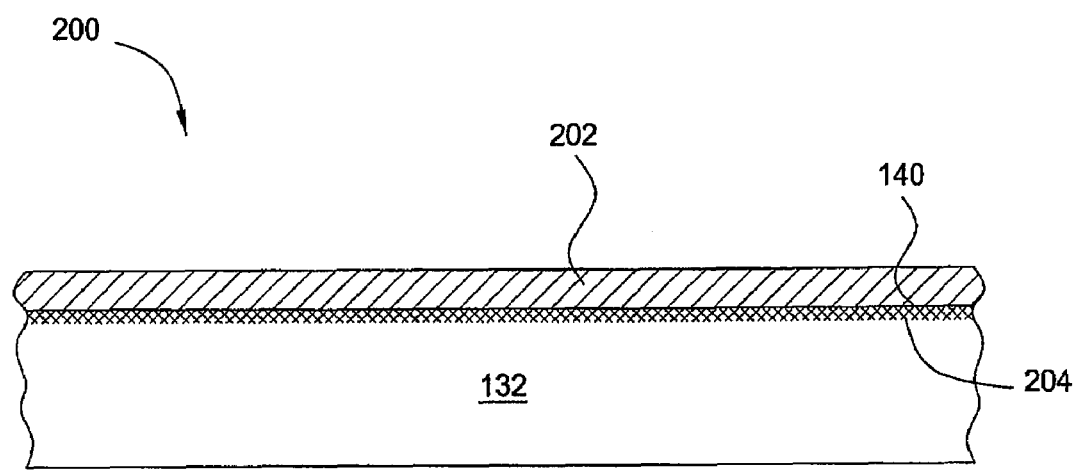
FIG. 2 depicts a sectional view of one embodiment of a substrate having a plasma resistive layer deposited thereon according the present invention.

FIG. 2 depicts a sectional view of one exemplary embodiment of a plasma resistive layer 202 coating on the substrate 132 applied by an aerosol deposition process using the apparatus 100 described in FIG. 1 or other suitable apparatus. The substrate 132 may be any component of a semiconductor processing chamber. In one embodiment, the component (e.g., the substrate 132) may be a substrate support assembly, an electrostatic chuck, a gas distribution plate, a shield, a process ring, a reticle holder, chamber lid, gas nozzle, a baffle, pumping channels, a chamber liner and/or wall, and the like. Portions of the substrate 132 may be masked such that the protective layer 202 is only formed on selected locations of the substrate 132.

The plasma resistive layer 202 deposited by aerosol deposition may be a ceramic layer composed of the raw material 108 ejected from aerosol generator 110. In one embodiment, the plasma resistive layer 202 is a rare earth metal containing material. For example, the rare earth metal may be yttrium (Y). In another embodiment, the plasma resistive layer 202 is yttrium containing material, such as bulk yttrium, yttrium oxide ($Y_2O_3$), yttrium alloy, yttrium-aluminum-garnet (YAG), or deviation thereof. In yet another embodiment, the plasma resistive layer 202 has a purity of yttrium containing material between about 98 weight percent and about 99.9 weight percent, such as greater than 99.5 weight percent. In another embodiment, the plasma resistive layer 202 has a porosity between about 0.001 $g/cm^3$ and about 0.01 $g/cm^3$.

Alternatively, the plasma resistive layer 202 may include $Y_2O_3$ mixed in a metal. Some metals include aluminum (Al), magnesium (Mg), titanium (Ti), tantalum (Ta), and the like. In further embodiments, the plasma resistive layer 202 may include doped $Y_2O_3$.

During aerosol deposition, some of the raw material 108 may be embedded into the substrate surface 140 and form a bonding layer 204 on the interface between the substrate surface 140 and the plasma resistive layer 202. The strong bonding layer 204 prevents the yttrium oxide ($Y_2O_3$) plasma resistive layer from cracking, peeling off, or stripping off during plasma processing. In one embodiment, the bonding layer 204 may be an alloy of the raw material 108 and the material of the substrate component. Alternatively, the bonding layer 204 may be a mixture of the material of the substrate 132 and the raw material 108. In embodiments that the yttrium containing material is utilized as raw materials, the bonding layer 204 may be a yttrium doped interface layer. In one embodiment, the bonding layer 204 may have a thickness between about 0.01 μm and about 0.2 μm. The plasma resistive layer 202 deposited on the substrate surface 140 may have a thickness between 1 μm and about 500 μm, for example, about 1 μm and about 100 μm, such as about 2 μm and about 30 μm.

The plasma resistive layer 202 made from the raw material 108 provides a plasma corrosion resistant coating on the substrate surface 140 that may be utilized to protect the exposed surfaces of a component and/r or part of a semiconductor chamber from the corrosive plasma and/or process gases. In one embodiment, the plasma resistive layer 202 is a yttrium oxide layer ($Y_2O_3$) having a high purity to minimize chamber contamination by impurities present in the yttrium oxide layer ($Y_2O_3$), thereby avoiding potential particulate release into the semiconductor processing chamber during plasma processing. The yttrium oxide layer ($Y_2O_3$) has a purity at least about 90 percent by volume yttrium oxide, such as at least about 99 percent by volume yttrium oxide, and a density of at least about 4.3 $g/cm^3$.

The yttrium oxide layer ($Y_2O_3$) also has a high hardness that resists corrosion and/or erosion during the plasma processing. In one embodiment, the yttrium oxide layer ($Y_2O_3$) provides a hardness (Vicker 5 Kgf) between about 3 GPa and about 11 GPa. Additionally, the yttrium oxide layer ($Y_2O_3$) has a surface roughness between about 2 μ-inch and 400 μ-inch, such as about 16 μ-inch, and water absorbency of about less than 0.02 percent of less.

As the raw material 108 may provide particles having an average diameter of less than 2 μm, such as less than about 0.5 μm, the resultant deposited plasma resistive layer 202 provides small grain size between about 0.01 μm and about 5 μm, such as between about 0.01 μm and about 1 μm, for example, about 0.01 μm and about 0.5 μm, such as less than about 0.1 μm. The small grain size of the plasma resistive layer 202 substantially eliminates particle generation while under plasma attack. Also, the small grain size provides a dense and close packed film structure, thereby promoting the resistive film properties. In one embodiment, the average crystalline grain size of the yttrium oxide plasma resistive layer 202 is about less than about 0.1 μm.

Thus, a method for low temperature aerosol deposition of a plasma resistive layer on semiconductor chamber components/parts is provided. The low temperature aerosol deposition allows the plasma resistive layer to be deposited on the components at a stable low temperature, thereby enhancing uniformity, minimizing coating stress, and preventing the chamber components from corrosive plasma environment, thereby increasing the chamber components life time.

While the foregoing is directed to embodiments of the present invention, other and further embodiments of the invention may be devised without departing from the basic scope thereof, and the scope thereof is determined by the claims that follow.

What is claimed is:

1. A method for low temperature aerosol deposition for semiconductor processing chamber components, comprising:
    forming an aerosol of fine particles in an aerosol generator;
    dispensing the aerosol from the generator into a processing chamber and toward a surface of a substrate comprising a material;
    maintaining the substrate temperature at between about 0 degrees Celsius and 50 degrees Celsius;
    embedding at least a portion of the fine particles in the surface of the substrate to form a bonding layer comprising an alloy of the fine particles and the substrate material; and
    depositing a layer from material in the aerosol on the bonding layer.

2. The method of claim 1, wherein the fine particles comprises a rare earth metal.

3. The method of claim 1, wherein the fine particle comprises a yttrium containing material.

4. The method of claim 3, wherein the yttrium containing material comprises at least one of bulk yttrium, yttrium oxide ($Y_2O_3$), yttrium alloy, yttrium-aluminum-garnet (YAG) or yttrium oxide ($Y_2O_3$) mixed in a metal.

5. The method of claim 3, wherein the yttrium containing material further comprises:
    a metal having the yttrium oxide ($Y_2O_3$) mixed therein, wherein the metal is at least one of aluminum (Al), magnesium (Mg), titanium (Ti) or tantalum (Ta).

6. The method of claim 1, wherein the fine particles have a diameter between about 0.05 μm and about 3 μm.

7. The method of claim 1, wherein the fine particles have a diameter less than about 2 μm.

8. The method of claim 1, wherein the layer deposited on the bonding layer is a plasma resistive layer.

9. The method of claim 1, wherein the step of forming the aerosol of fine particles further comprises:

providing a carrier gas into the aerosol generator; and ejecting the fine particles entrained with the carrier gas to the processing chamber.

10. The method of claim 9, wherein the carrier gas comprises at least one of Ar, He, Xe, $O_2$, $N_2$, and $H_2$.

11. The method of claim 10, wherein the step of providing a carrier gas further comprises:

maintaining a pressure of the carrier gas in the aerosol generator between about 10 Pa and about 50 Pa.

12. The method of claim 1, wherein the step of ejecting the aerosol of the fine particles further comprises:

delivering the aerosol of the fine particles toward the substrate surface at a rate at between about 250 m/s and about 1750 m/s.

13. The method of claim 1, wherein the layer deposited on the bonding layer has a thickness between about 1 μm and about 100 μm.

14. The method of claim 1, wherein the layer deposited on the bonding layer has a grain size between about 0.01 μm and about 1 μm.

15. The method of claim 1, wherein the bonding layer has a thickness between about 0.01 μm and about 0.2 μm.

16. The method of claim 1, wherein the substrate is a component used in or part of a semiconductor plasma processing chamber.

17. A method for low temperature aerosol deposition for semiconductor processing chamber components, comprising:

forming an aerosol of fine particles in an aerosol generator;

dispensing the aerosol from the generator into a processing chamber toward a surface of a substrate comprising a material;

maintaining the substrate temperature at between about 0 degrees Celsius and 50 degrees Celsius;

embedding at least a portion of the fine particles in the surface of the substrate to form a bonding layer comprising an alloy of the fine particles and the substrate material; and depositing a rare earth metal containing layer on the bonding layer.

18. The method of claim 17, wherein the fine particles have a diameter less than about 2 μm.

19. The method of claim 17, wherein the rare earth metal containing layer is a yttrium containing material.

20. A method for low temperature aerosol deposition for semiconductor processing chamber components, comprising:

forming an aerosol of fine particles in an aerosol generator having a diameter less than 2 μm;

dispensing the aerosol from the generator into a processing chamber toward a surface of a substrate comprising a material;

maintaining the substrate temperature at between about 0 degrees Celsius and 50 degrees Celsius;

embedding at least a portion of the fine particles in the surface of the substrate to form a bonding layer comprising an alloy of the fine particles and the substrate material; and depositing a rare earth metal containing layer on the bonding layer.

21. The method of claim 20, wherein the rare earth metal containing layer is a yttrium containing material.

* * * * *

UNITED STATES PATENT AND TRADEMARK OFFICE
CERTIFICATE OF CORRECTION

PATENT NO. : 7,479,464 B2  Page 1 of 1
APPLICATION NO. : 11/552013
DATED : January 20, 2009
INVENTOR(S) : Sun et al.

It is certified that error appears in the above-identified patent and that said Letters Patent is hereby corrected as shown below:

On the Title Page, Item -56- In the References Cited:

Please delete "2004/0126814 A1 7/2004 Maeda et al." and insert --2004/0126614 A1 7/2004 Maeda et al.-- therefor.

Signed and Sealed this

Twenty-first Day of April, 2009

JOHN DOLL
*Acting Director of the United States Patent and Trademark Office*